United States Patent [19]

Di Renzo

[11] 3,834,015

[45] Sept. 10, 1974

[54] METHOD OF FORMING ELECTRICAL CONNECTIONS

[75] Inventor: Simon Di Renzo, Philadelphia, Pa.

[73] Assignee: Philco-Ford Corporation, Blue Bell, Pa.

[22] Filed: Jan. 29, 1973

[21] Appl. No.: 327,647

[52] U.S. Cl. .................................... 29/628, 29/481
[51] Int. Cl. ............................................ H01r 43/00
[58] Field of Search .......... 29/470.1, 481, 503, 628, 29/630 D, 203 B, 203 MW; 228/1, 37, 19

[56] References Cited

UNITED STATES PATENTS

| | | | |
|---|---|---|---|
| 3,553,824 | 1/1971 | Kozelnicky | 228/19 |
| 3,604,609 | 9/1971 | Walls | 228/19 |
| 3,713,876 | 1/1973 | Lavric | 29/503 |
| 3,721,379 | 3/1973 | Corsaro | 29/503 |
| 3,726,007 | 4/1973 | Keller | 29/503 |

*Primary Examiner*—Richard J. Herbst
*Assistant Examiner*—James R. Duzan
*Attorney, Agent, or Firm*—Harry W. Hargis, III; Robert D. Sanborn

[57] ABSTRACT

A method of manufacturing printed circuit boards of the type having a plurality of contact pins projecting from one side thereof and adapted for use as wire-wrap terminals connecting board-carried wiring to external circuits. The method includes the steps of immersing the pins and adjacent board regions in molten solder to connect the pins to the circuits carried by the board, followed by immersing the end regions of the pins in molten solder while vibrating the boards to remove excess solder from the end portions of the pins.

12 Claims, 7 Drawing Figures

PATENTED SEP 1 0 1974 3,834,015

METHOD OF FORMING ELECTRICAL CONNECTIONS

BACKGROUND OF THE INVENTION

This apparatus relates to electrical connections, and more particularly to a method of forming electrical connections of the solder type and particularly adapted for the formation of wire-wrap connections thereon.

The availability of multilayer back panels and miniature connectors having closely spaced wire-wrap pins has made possible much greater packaging and wiring densities in many types of electronic equipment. Successful production of back panel assemblies of this type have posed difficult manufacturing problems, especially in soldering the closely spaced connector pins to the conductive pads of plated-through holes in the multilayer boards. Immersion soldering techniques are ideally suited for the formation of solder fillets between the pins and the conductive pads. Such techniques have not been completely satisfactory, however, since they frequently leave solder residues which are detrimental to achievement of satisfactory wire-wrap connections. For example, immersion soldering has resulted in the formation of small solder "flags" or droplets on the ends of the connector pins. These solder accumulations present difficulties when the back pan connector assembly is wired in automated wire-wrap machinery. The solder accumulations interfere with the wire-wrap tool as it moves down over the ends of the pins to make the wire wrap connections.

A number of soldering methods have been directed to facilitating achievement of solder bonds that would not interfere with subsequently made wire-wrap connections. The methods have included: placing preformed bodies of solder on the connector pins, and solder bonding either by heating the individual pins or by heating the entire assembly in an oven; and using immersion soldering techniques in which the end portions of the pins have been selectively coated with a solder-resistant material which requires subsequent removal. Such methods of bonding have been found to be time consuming.

It is an objective of this invention to provide an improved method for forming electrical connections of the aforementioned type, which method overcomes the above described difficulties, and lends itself to utilization of immersion soldering techniques.

SUMMARY OF THE INVENTION

To the foregoing general ends, preferred practice of the invention contemplates an improved method of manufacturing printed circuit boards of the type having a plurality of contact pins projecting from one side thereof, which pins are adapted for use as wire-wrap terminals connecting board-carried wiring to external circuits.

The method is characterized by the steps of subjecting the boards and pins to a bath of molten solder to connect the pins to the circuits carried by the board, followed by subjecting the end regions only of the pins to a bath of molten solder and vibrating the boards and pins to remove excess molten solder from the end regions of the pins.

DETAILED DESCRIPTION OF THE METHOD

Figures 1, 2, 3, 4, 5, 6, 7:
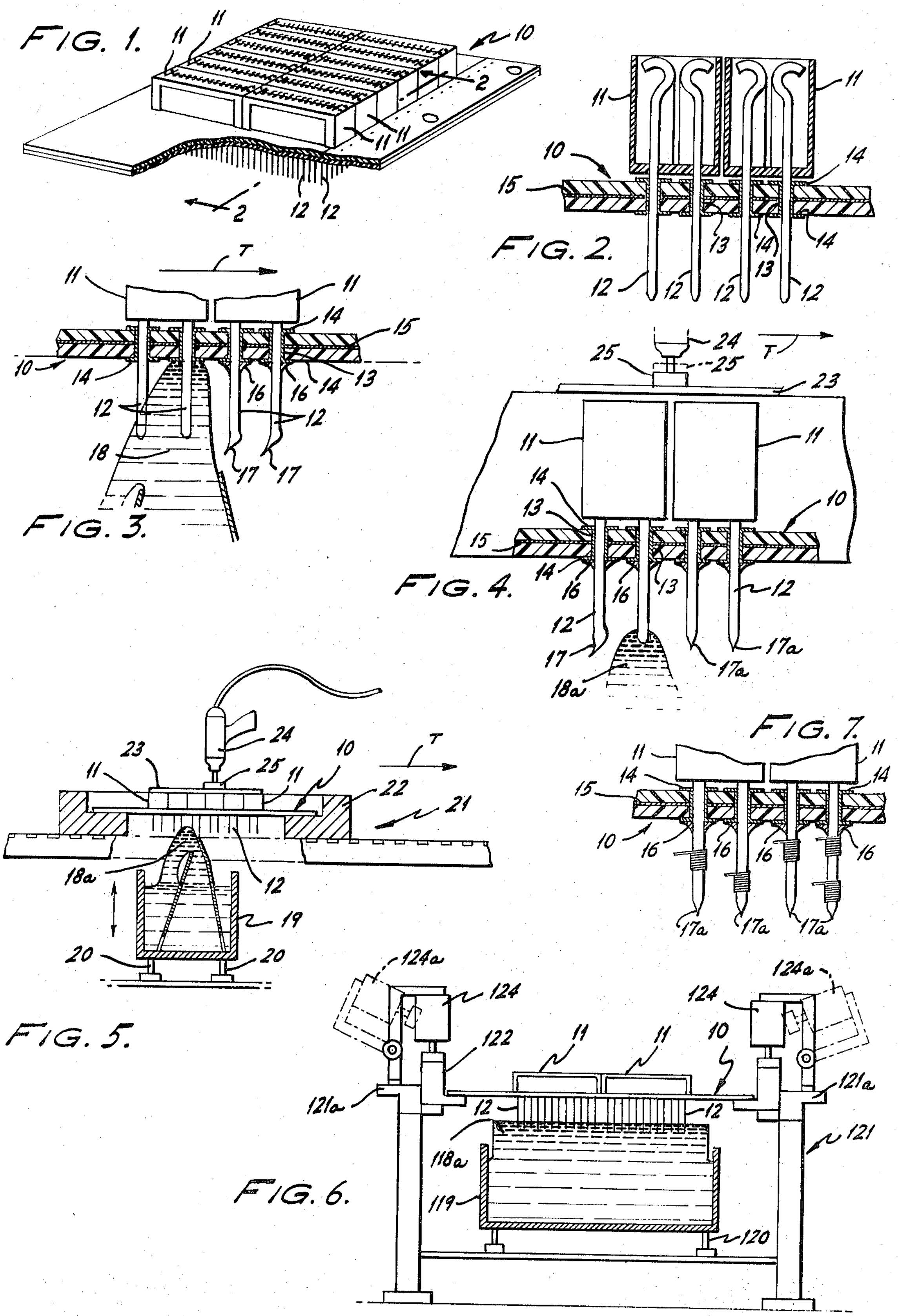
FIG. 1 is a partially fragmentary perspective showing of a printed wiring panel board on which the method of the invention may be practiced.
FIG. 2 is an elevational showing, partly in section, of apparatus shown in FIG. 1 as seen looking generally in the direction of arrows 2—2 applied thereto.
FIG. 3 is a sectional showing similar to FIG. 2, and illustrating an initial step in the method.
FIG. 4 is a sectional showing similar to FIG. 3, and illustrating a further step in the method.
FIG. 5 is an elevational-sectional showing of overall apparatus for implementing the method of the invention, and particularly that step shown in FIG. 4.
FIG. 6 is a generally transverse elevational-sectional showing of apparatus of the type shown in FIG. 5, and illustrating a modified apparatus for carrying out the method.
FIG. 7 is a view similar to FIG. 2, and further showing solder and wrapped wire connections as they appear in a completed assembly.

With more particular reference to the drawing, and first to FIGS. 1 and 2, a multilayer wiring board 10 to be processed according to the invention has mounted thereon a quantity of sockets 11 for receiving and supporting smaller, component-carrying wiring boards (not shown) of conventional type. The sockets 11 include connector pins 12, preferably gold plated, extending therefrom through apertures defined by members 13 of conductive material, for example copper, provided with solder pads 14 at opposed ends thereof. Members 13 are electrically connected to multilayer circuit elements sandwiched between layers of the insulative board. Only one such circuit element is shown, and is designated by the numeral 15. Base portions of selected pins 12 are electrically bonded to solder pads 14 of corresponding members 13, by means of the process fully described below.

The present invention is directed to an improved, novel process or method for applying solder to complete the connections between pins 12 and pads 14 in such manner as to facilitate further interconnection of selected ones of pins 12 by wire-wrap techniques. Considering that a square inch of board area may include about fifty pins of the type designated by the numeral 12, considerable care must be taken to ensure that the solder does not bridge between adjacent pads 14, and that the same solder does not create discontinuities in the gold-plated surfaces of the pins or bridge between pins to which wire-wrap connections are to be made.

With reference to FIG. 3, board 10 is moved from left to right in accordance with directional arrow T, to subject pins 12 to a "wave" 18 of molten solder, in a bath 19 of known type, and in the presence of a mild solder flux (not shown) such as rosin which has been applied according to conventional techniques. As shown in the drawing, the machine is of the known type in which the wave is produced by passing the solder through a pair of spaced plates which form an elongated nozzle. Solder adheres to the gold plated pins 12 and to the adjacent pads 14, and solidifies to form fillets, as seen at 16. Solder adherent to the end regions of pins 12 solidifies generally in the form of "flags" 17 that extend laterally between the pins. Such flags present difficulties when it is desired to make wire-wrap connections of the type seen in FIG. 7, particularly when using automated wrap tools of known construction. The flags 17 in such instance interfere with operation of a wire-wrap bit as it is caused to move telescopingly onto each of the relatively closely spaced pins, in a programmed sequence.

The invention proposes further operational steps directed to removal of flags 17, thereby to overcome the above-described difficulties. In effecting the further operational steps, and with reference to FIG. 4, solder wave 18 and board 10 are separated (see relatively lowered wave 18*a*), sufficiently far to immerse from about one-sixteenth inch to about one-eighth inch of the end portion of each pin 12 in the solder. Positioning of wave 18*a* can be achieved either by reducing the height of the wave itself, or by lowering bath 19, as may be provided for by adjustable legs 20 (FIG. 5), or by raising the board.

The boards are moved laterally, to the right as seen in FIGS. 4 and 5, at a velocity of about 1 foot/minute by suitable conveyor means designated generally by the numeral 21. Each board 10 is supported along its periphery by a frame 22 on the conveyor. In especial accordance with the invention, a flat member 23 is placed against the upper surface of frame 22, and in a region of the latter just above the pins 12 emerging from solder wave 18. The tip 25 of a suitable vibrator device, such for example as a hand-held riveting gun 24, is positioned against member 23 as shown, and the device is energized. Tip 25 vibrates between positions thereof shown in full and phantom lines in FIG. 4, imparting vibrations in a vertical direction to sockets 11 and their pins through the agency of member 23 and frame 22. The resultant, substantially uniform vibration of pins 12 within the hot bath transforms remelted flags 17 into solder droplets 17*a* of lesser size, and which droplets tend to extend in the direction of length of the pins 12. Following transformation of the flags as described, solder flux is removed, and the desired wire-wrap connections shown in FIG. 7 are made with ease.

An alternative apparatus for carrying out the method of the invention is seen in FIG. 6. With more detailed reference to that figure, a conveyor 121 is similar to the one illustrated in FIG. 5, being viewed instead in a generally transverse section thereof. A frame 122 is carried by the conveyor, and supports a panel board 10 and associated component elements identical with those seen in the preceding figures. The conveyor 121 includes support means 121*a* on which a pair of vibrator devices 124 are pivotally mounted for movements between full line positions thereof and the broken line positions seen at 124*a*. Vibration imparting pads 125 of devices 124 are movable, upon pivotation of the latter to full line positions thereof, into slidable abutting engagement with support frame 122. An elevatably adjustable solder bath 119 is located below conveyor 121, and produces a solder wave through which pins 12 and pads 14 may be caused to move, either the former individually or both simultaneously. For convenience, the wave is shown in its lower, pin immersing position 118*a*. The pads 125 are so positioned as to engage frame 122 at a position adjacent the solder wave, to the side thereof in which the conveyor is caused to travel.

In operation, and with the vibrator devices 124 in their retracted, broken line positions, the solder wave is located in its upper position (compare wave 18 in FIG. 3) to solder-bond pins 11 to pads 14, as frame 122 and board 10 are moved along by conveyor 121. Following completion of solder-bonding pads 14 to pins 11, the frame 122 is repositioned on conveyor 121, and the wave is lowered to the position thereof designated 118*a*, so as to engage the pins in accordance with the showing of wave 18*a* in FIG. 4. Also at this time, vibrator devices 124 are moved into their full line positions, and are energized as conveyor 121 moves frame 122. Thus, as frame 122 is moved by the conveyor, it is vibrated by pads 125, whereby pins 11 are freed of flags 17 in the same manner as is shown in FIG. 4.

From the foregoing, it will be appreciated that the method of the invention achieves removal of undesired solder without adversely affecting the solder bonding fillets 16. It will be further understood that vibration may be effected by other known means such, for example, as electrically driven as well as mechanically actuated vibrator devices. While it is preferred to select a device that will impart to a pin inertial vibratory shock sufficient to overcome surface tension of the molten solder and remove an excess amount thereof, it may in some applications suffice to vibrate only enough to transform a body of solder into a more desirable configuration without complete removal of the undesired solder.

I claim:

1. In the manufacture of circuit boards of the type having a plurality of closely spaced contact pins projecting from one side thereof in substantial parallelism and in regions of similarly closely spaced terminal means for circuit elements to which solder connections are to be made, and which pins have base portions soldered to said terminal means and free end portions adapted for use as wire-wrap terminals connecting such board-carried circuit elements to external wiring circuits, an improved method for immersion soldering said pin base portions to said terminal means while leaving the free ends of said pins substantially devoid of solder protrusions detrimental to the formation of wire-wrap connections, comprising the steps of: immersing said pins in a bath of molten solder to the level of said terminal means, to solder-bond the pins to the terminal means; immersing free end portions only of said pins in a bath of molten solder; and removing said pin end portions from the bath and vibrating said pins to remove excess molten solder from said free end portions.

2. The method according to claim 1, and characterized in that said pins are vibrated generally in the direction of their lengths.

3. The method according to claim 2, and characterized in that said step of vibrating said pins is carried out as said pin end regions emerge from said solder bath.

4. The method according to claim 3, and further characterized in that immersion of said pins is effected using wave soldering techniques.

5. The method according to claim 1, and characterized in that said pins are immersed in a wave of solder.

6. The method according to claim 1, and characterized in that said pins are immersed in a wave of solder, while said circuit board is moved laterally to immerse said pins and terminals.

7. The method according to claim 6, and characterized further in that said board is moved laterally at a rate of about 1 ft./min.

8. The method according to claim 6, and characterized in that said board is supported in frame means, and vibrations are imparted to said board and pins through vibration of the frame means.

9. In the manufacture of circuit boards of the type having a plurality of closely spaced contact pins projecting from one side thereof in substantial parallelism and in regions of similarly closely spaced terminal means for circuit elements to which solder connections are to be made, and which pins have base portions soldered to said terminal means and free end portions adapted for use as wire-wrap terminals connecting such boardcarried circuit elements to external wiring circuits, an improved method for immersion soldering said pin base portions to said terminal means while leaving the free ends of said pins substantially devoid of solder protrusions detrimental to the formation of wire-wrap connections, comprising the steps of: immersing said pins in a bath of molten solder to the level of said terminal means, followed by removal of said pins from said bath to solder-bond the pins to the terminal means; immersing free end portions only of said pins in said bath of molten solder to melt residual solder on said end portions; removing said free end portions of said pins from said bath; and vibrating said pins while said residual solder is molten to reduce any lateral extent of such molten solder from said free end portions.

10. The method according to claim 9, and characterized in that said pins are vibrated generally in the direction of their lengths.

11. The method according to claim 10, and characterized in that said pins are immersed in a wave of solder, while said circuit board is moved laterally to immerse said pins and terminals.

12. The method according to claim 11, and characterized in that said board is supported in frame means, and vibrations are imparted to said board and pins through vibration of the frame means.

* * * * *